United States Patent
Reiderman

(10) Patent No.: US 11,815,482 B2
(45) Date of Patent: Nov. 14, 2023

(54) METHOD AND APPARATUS FOR HIGH-THROUGHPUT NUCLEAR MAGNETIC RESONANCE MEASUREMENTS ON BOREHOLE MATERIALS

(71) Applicant: Arcady Reiderman, Richmond, TX (US)

(72) Inventor: Arcady Reiderman, Richmond, TX (US)

( * ) Notice: Subject to any disclaimer, the term of this patent is extended or adjusted under 35 U.S.C. 154(b) by 0 days.

(21) Appl. No.: 17/828,024

(22) Filed: May 30, 2022

(65) Prior Publication Data

US 2022/0390396 A1   Dec. 8, 2022

Related U.S. Application Data

(60) Provisional application No. 63/195,102, filed on May 31, 2021.

(51) Int. Cl.
*G01N 24/08*    (2006.01)
*G01R 33/58*    (2006.01)
*G01R 33/561*   (2006.01)

(52) U.S. Cl.
CPC ....... *G01N 24/081* (2013.01); *G01R 33/5615* (2013.01); *G01R 33/583* (2013.01)

(58) Field of Classification Search
CPC ............. G01N 24/081; G01R 33/5615; G01R 33/583; G01R 33/385; G01R 33/307; G01R 33/483
See application file for complete search history.

(56) References Cited

U.S. PATENT DOCUMENTS

| | | | | |
|---|---|---|---|---|
| 4,549,136 A | * | 10/1985 | Zens | G01R 33/30 324/308 |
| 6,049,205 A | * | 4/2000 | Taicher | G01V 3/32 324/303 |
| 2018/0364184 A1 | * | 12/2018 | Reiderman | G01R 33/4835 |

* cited by examiner

*Primary Examiner* — G. M. A Hyder

(57) ABSTRACT

A method for NMR measurements on borehole materials, e.g., sidewall cores, is based on performing a standard measurement in substantially homogeneous magnetic fields with a sensitivity volume covering an entire sample and a measurement on a fragment of the sample (local measurement), the fragment having a predetermined volume independent of the irregularities of the sample shape (e.g., irregular shaped edges). The fragment of the sample is selected using a switchable static magnetic field gradient or a localized radio-frequency magnetic field. The homogeneous and the local measurement data are processed jointly to obtain volume normalized NMR relaxation data (in porosity units), the processing also using a calibration sample data. A measurement apparatus with an automated sample transfer can be used to implement the method in order to perform high-throughput NMR relaxation measurements that do not require independent measurement of the sample volume.

19 Claims, 8 Drawing Sheets

METHOD AND APPARATUS FOR HIGH-THROUGHPUT NUCLEAR MAGNETIC RESONANCE MEASUREMENTS ON BOREHOLE MATERIALS

CROSS-REFERENCE TO RELATED APPLICATIONS

This application is related to a provisional patent application claiming the benefit 35 USC 119(e). The provisional patent application number is 63/195,102; filing date is May 31, 2021.

STATEMENT REGARDING FEDERALLY SPONSORED RESEARCH OR DEVELOPMENT

Not applicable.

FIELD OF THE INVENTION

This invention relates to a low frequency nuclear magnetic resonance (NMR) for the oil-bearing earth formations evaluation purposes. More specifically the invention applies to the NMR measurement performed on the surface, in particular on the well site.

BACKGROUND OF THE INVENTION

Low frequency NMR relaxation measurements are performed as part of the earth formations evaluation during and after drilling of an oil well. The measurement can be performed downhole and on the surface at the well site or in a laboratory. This invention relates to the surface NMR measurements using borehole materials including, sidewall cores, core stacks, drill cuttings, microcores and others.

Surface NMR relaxation measurements are typically conducted in laboratory using a standard or specialized NMR relaxometer that includes a permanent magnet that generates a static magnetic field and an NMR antenna generating a radio-frequency (RF) magnetic field that is perpendicular to the static magnetic field. The static magnetic field aligns nuclei in a sample with the direction of the static magnetic field. The rate at which the bulk magnetization is established is described by a spin-lattice relaxation (also called longitudinal relaxation) characterized by a time constant T1. The RF magnetic field is typically applied in a form of a sequence of RF pulses (e.g., a standard CPMG pulse sequence) to produce a sequence of spin echoes. The amplitudes of the spin echoes produced by a standard CPMG pulse sequence make points of a spin-spin relaxation curve (also called transversal relaxation curve) characterized by a time constant T2. The total amplitude of the relaxation curve and the distribution of the relaxation times T2 and T1 are the NMR properties that can be interpreted to relate them to petrophysical parameters of the borehole materials, e.g., porosity, pore size distribution, amount of bound and free fluids in the pore space, wettability of the pore surface, and others.

The NMR relaxation measurements on borehole materials are a low frequency NMR relaxometry that intends to match 0.4 MHz-2 MHz frequency range of typical downhole NMR measurement so the downhole and the surface NMR measurements can complement each other.

In existing configurations, an NMR relaxometer performs measurements in a core laboratory on core plugs or sidewall cores manually loaded in a sample holder. The existing configurations of apparatus and methods do not address functionality desired for cost efficient, high-throughput automated measurements, in particular, the well-site measurements. Practical sidewall core samples have different length and irregular shaped edges, therefore the automated, high throughput measurements calibrated to porosity (requiring known volume) becomes a problem.

There is a need for efficient surface NMR measurement methods and apparatus that address the above-mentioned deficiencies of the existing low frequency NMR relaxation measurements.

BRIEF DESCRIPTION OF THE DRAWINGS

For a detailed description of the embodiments of the invention, reference will now be made to the accompanying drawing in which like numerals refer to like elements. The drawings are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION OF THE INVENTION

Embodiments of this disclosure are directed to high throughput NMR relaxation measurements conducted on borehole materials, in particular, sidewall cores.

Figure 1:
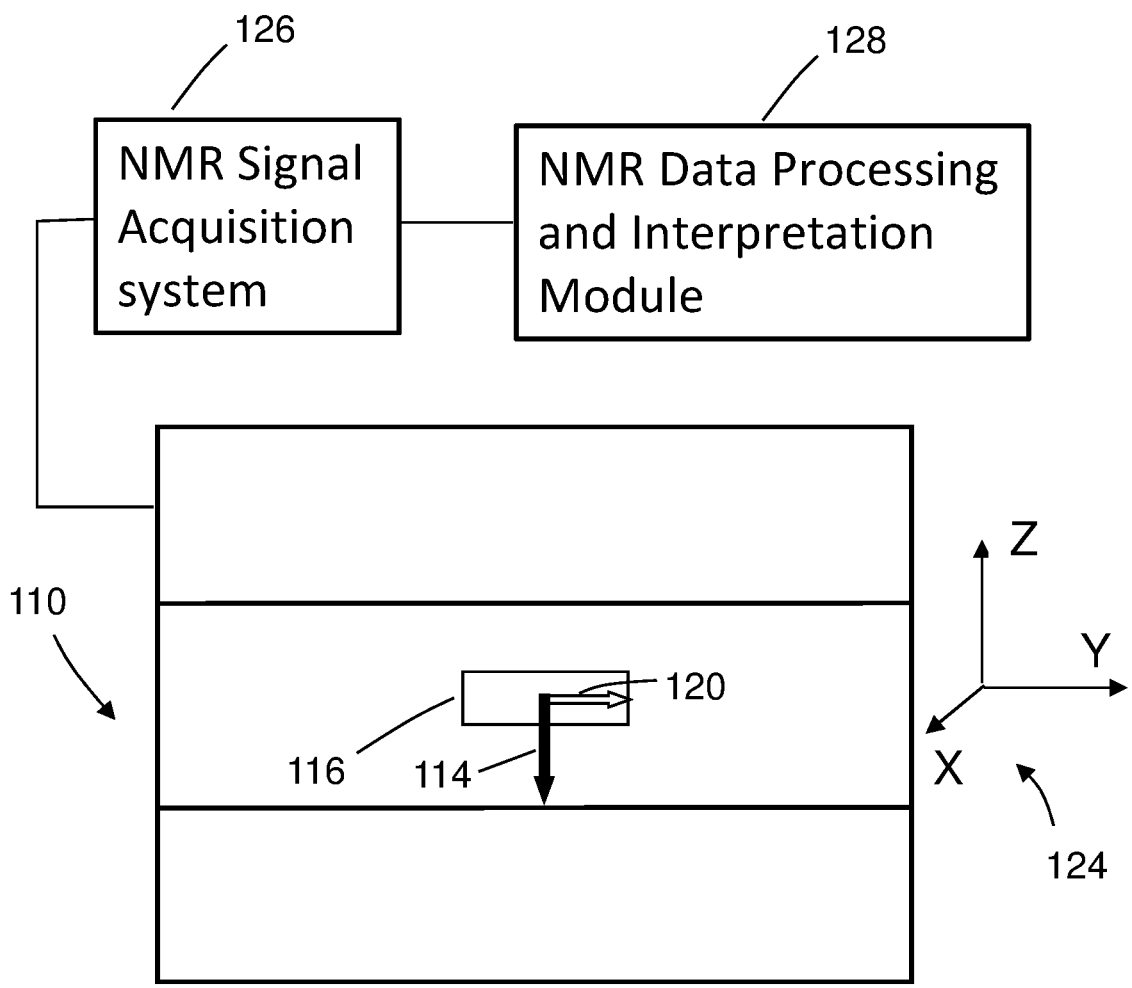
FIG. 1 shows an exemplary embodiment of a low field NMR relaxometer.

FIG. 1 shows general components of an NMR relaxometer that are present in the disclosed embodiments. The sensing unit 110 includes a permanent magnet assembly and an NMR antenna (not shown in FIG. 1) to generate a static magnetic field 114 (either substantially homogeneous or a gradient magnetic field) and a radio-frequency (RF) magnetic 120 in a sample area 116. The NMR antenna may be used for both generating the RF magnetic field in the sample area and receiving NMR signals from a sample placed in the sample area. In the Cartesian coordinate system shown at 124 the static magnetic field is in Z-direction, the RF magnetic field and the sensitivity of the RF antenna is in Y-direction. An acquisition system 126 supplies an RF current in a form of an NMR pulse sequence when exciting NMR in the sample and receive NMR signals emanating from the sample in response to the NMR pulse sequence. The permanent magnet assembly is preferably configured to generate the static magnetic field 114 in vertical direction (Z-direction) to make the field measurement insensitive to positioning of the sensing unit 110 on a horizontal plane: rotating the magnet assembly while keeping magnetic field vertical does not change the angle of the magnetic field with respect to the Earth's magnetic field.

NMR data processing and interpretation module 128 is used to process the received NMR signals and invert the processed data to obtain NMR parameters (e.g., parameters of the NMR relaxation spectrum) that can be related to petrophysical properties of the sample.

Figure 2:
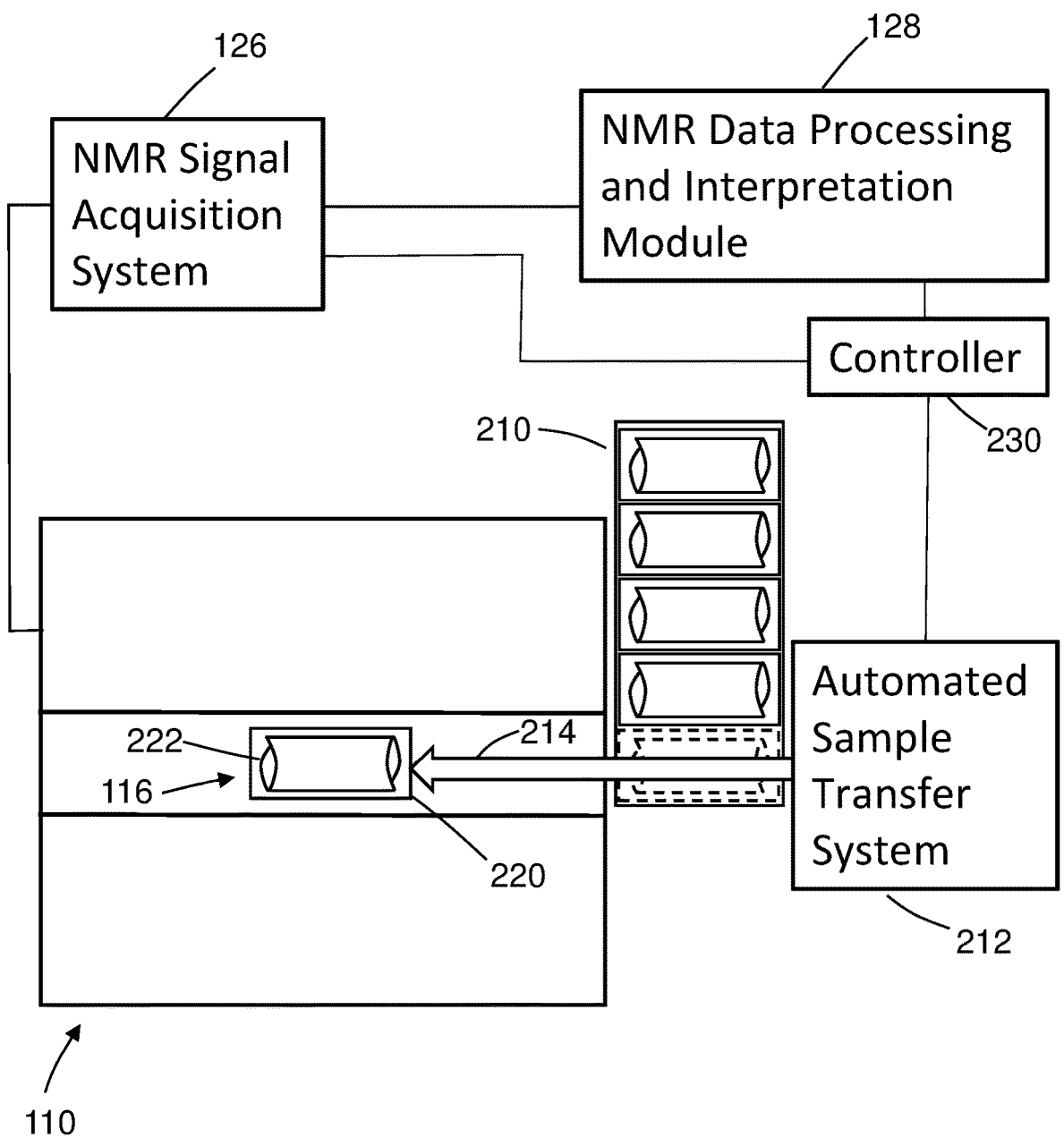
FIG. 2 shows a partial view of a high-throughput automated low field NMR relaxometer for measurements on borehole materials, specifically on sidewall cores.

FIG. 2 depicts an embodiment of a high-throughput automated low field NMR system for measurements on borehole materials, specifically, on sidewall cores. The automated system includes a sample cassette 210 with a batch of samples loaded, a sample transfer system 212 and an actuator 214 to automatically move a sample container 220 with a sample of the borehole material (222) inside. The NMR system of FIG. 2 also includes a controller 230 that provides controls for other systems and modules of the system. The sample transfer system 212 may comprise guides, motors and other mechanical and electromechanical means (not shown in FIG. 2). The actuator 214 may be embodied as a retractable part to reduce the footprint of the system.

It is typically required (e.g., in order to compare with downhole NMR measurements) for the NMR measurements on the rock samples to be calibrated to porosity (presented in porosity units), which requires known volume of the sample. Sidewall core samples have different length and irregular shaped edges. The need for a fast measurement of the sample volume makes it difficult to implement automated, high-throughput measurements when a calibration to porosity is required. The embodiments of the measurement systems and methods below do not require independent measurement of the sample volume and therefore enable high-throughput automated measurements.

Figure 3:
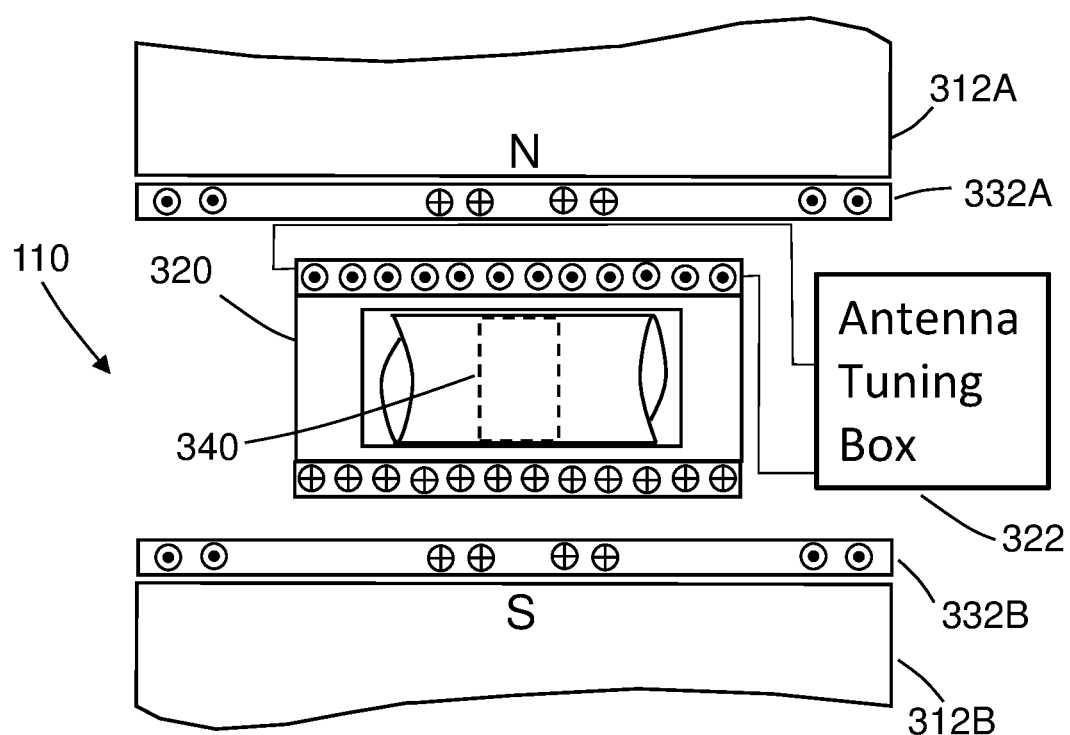
FIG. 3 shows a partial view of a sensor unit of high-throughput automated low field NMR relaxometer with controllable (switchable) gradient of static magnetic field.

FIG. 3 illustrates an embodiment of the sensor unit 110 with controllable (switchable) gradient of the static magnetic field. The sensor unit includes a magnet assembly represented by the magnet poles 312A and 312B, an antenna 320 presented as a coil (with an instant directions of the RF current shown by dots and crosses) to generate RF magnetic field in Y-direction (FIG. 1) and an antenna tuning box 322 connected to the antenna to provide the antenna tuning to the NMR excitation frequency. The sensor unit further includes the static magnetic field gradient coils shown at 332A and 332B (the dots and the crosses at 332A and 332B show the directions of a direct (DC) current in the coils) that, if driven with a DC current, produce a gradient of the static magnetic field in Y-direction (the coordinate system is shown at 124 in FIG. 1).

Due to the gradient of the static magnetic field the Larmor frequency over the sample becomes axially (Y-direction) dependent. Only the nuclei with the Larmor frequencies that are substantially within the frequency band of the RF magnetic field get excited. In case of a standard pulsed NMR excitation, (for example, when a CPMG excitation pulse sequence is used) the excitation frequency band is defined by the expression (1)

$$\omega_0 - \frac{1}{2 \cdot \tau_R} \le \omega \le \omega_0 + \frac{1}{2 \cdot \tau_R}, \quad (1)$$

where $\tau_R$ is the pulse width of the refocusing RF pulse of the CPMG pulse sequence; $\omega_0$ is the Larmor frequency at the central plane (perpendicular to the Y-axis) of the magnet assembly. The spatial region in which the Larmor frequencies satisfy the inequality (1) makes the sensitivity volume 340 (the boundaries of the sensitivity volume may look like the ones shown by the dashed lines at 340). In case of a substantially uniform axial gradient of the static magnetic field and the sample having cylindrical surface (with the axis in Y-direction) the sensitivity volume is a cylindrical slice perpendicular to the sample axis. The thickness $\Delta y$ of the slice can be presented as (equation (2))

$$\Delta y \approx \frac{2\pi}{\tau_R} \cdot \frac{1}{\gamma \cdot G}, \quad (2)$$

where $\gamma$ is the gyro-magnetic ratio for the nuclear spins (typically hydrogen nuclei for most of the cases of the earth formations evaluation); G is the gradient of the static magnetic field. The thickness of the slice can be controlled by either changing the RF pulse width or by changing the gradient. An axial position of the slice may be controlled by changing the frequency of the RF pulse or by adding homogeneous magnetic field that can be also produced by the coils 332A and 332B.

Once the sensitivity volume is defined by the inhomogeneity of the static magnetic field and other system parameters (rather than by the shape and volume of the sample) the measurements can be easily calibrated to porosity (assuming the porosity is filled with a fluid with known hydrogen index) using a calibration sample with known hydrogen content.

Equation (1) applies to any spatial distribution (inhomogeneity) of the static magnetic field. Instead of using a magnet assembly with substantially uniform statis magnetic field and a uniform gradient a relatively small and inexpensive magnet can be designed to have a saddle point (a zero-gradient point) in the center of the sensitive volume. Finite bandwidth of the NMR system may cause selection of a sensitivity volume inside the sample. The size of the selected volume may be controlled by the RF pulse width and/or the bandwidth of the receiver system. A relatively short NMR antenna (coil) may be used in this case (just to cover the selected sensitivity volume). This type of NMR antenna gives benefits of higher signal-to-noise ratio of measurements. Adjustment coils similar to the coils 332A and 332B can still be used to generate a quasi-homogeneous static magnetic field in order to compensate for temperature variations of the static magnetic field. Alternatively, a frequency adjustment can be used for the same purpose.

Figure 4:
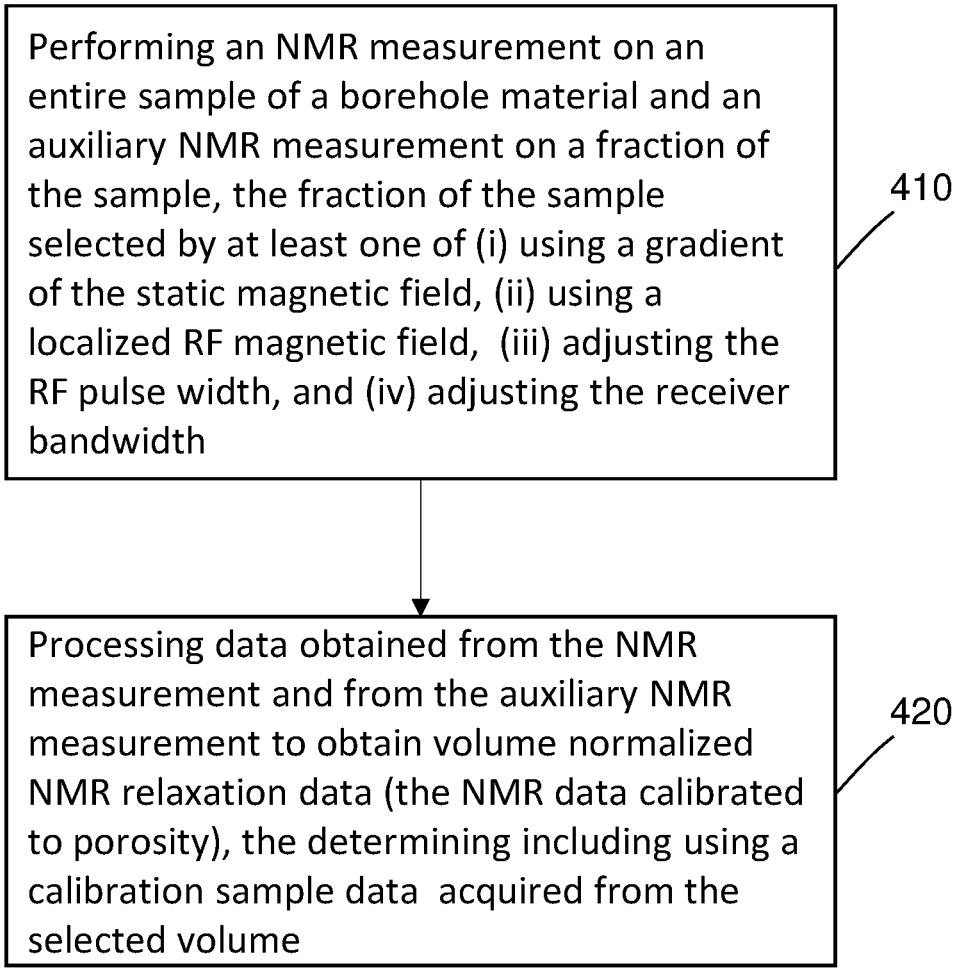
FIG. 4 illustrates a method of fast NMR measurement on a sample of irregular (unknown) shape using acquiring data from a fraction of the sample volume and from the entire volume.

In order for the sensitivity volume 340 to be the same for all samples the axial extent of the volume needs to be smaller than the regular (cylindrical with 1.5 inches diameter in a typical case of a sidewall core) segment of the shortest sample in a batch of samples. Practically, it means that for most of the samples the selected sensitivity volume (e.g., using the gradient of the static magnetic field as shown earlier above) is significantly smaller than the volume of the entire sample. This may degrade the signal-to-noise ratio of measurements and therefore make the measurements longer (more data stacking needed). A preferred embodiment of an NMR measurement on a sample having an irregular (unknown) shape is illustrated in FIG. 4. It comprises a step (410) of performing the NMR measurement on an entire sample of a borehole material (e.g., a sidewall core) and an auxiliary NMR measurement on a fraction of the sample, the fraction of the sample selected using a gradient static magnetic field as explained above or using other technique as will be explained further below. NMR measurements are also conducted on a calibration sample having known volume. The data are processed (step 420) to determine volume normalized NMR data (calibrated to porosity). The method is illustrated by the calculations below (equations (3)-(7)). NMR relaxation signal $p_{pu}(t)$ calibrated to porosity can be calculated as follows $$p_{PU}(t) = 100 \cdot C \cdot s(t) \cdot \frac{1}{V}, \quad (3)$$

where C is the calibration coefficient, s (t) is the NMR relaxation curve (presented in arbitrary units), and V is the sample volume.

The calibration coefficient can be presented in the form:

$$C = V_{cal} \cdot \frac{1}{s_{cal}(0)}, \quad (4)$$

where $V_{cal}$ is calibration sample volume, $s_{cal}$ (0) is the amplitude of the relaxation curve (relaxation data extrapolated to zero-time point).

The following relationships can be used to calculate the volume V:

$$\frac{s}{s_f} = k \cdot \frac{V}{V_f}, \quad (5)$$

where S and $S_f$ represent NMR signal for the entire sample and from a selected fraction of the sample respectively, k is a constant coefficient, V and $V_f$ are the volume of the entire sample and the volume of the selected fraction respectively. The same relationship applies to the measurement on the calibration sample:

$$\frac{s_{cal}}{s_{cal\_f}} = k \cdot \frac{V_{cal}}{V_{cal\_f}} \quad (6)$$

The calibration sample may be made having the same diameter as the sidewall core sample (e.g., 1.5 inches). In this case $V_f = V_{cal\_f}$ and for the sample volume we have $$V = V_{cal} \cdot \frac{s}{s_{cal}} \cdot \frac{s_{cal\_f}}{s_f}. \quad (7)$$

The NMR signal is preferably acquired using a standard CPMG sequence producing a sequence of spin-echo signals $s_i$, each spin-echo signal making a point on the NMR relaxation curve. In order to increase signal-to-noise ratio (SNR) when determining the sample volume, the NMR signals in the equations (5)-(7) are preferably chosen to be total signals, for example, defined as a sum of the spin echo signals: $S=\Sigma_i s_i$. A weight function can be used when calculating (using the summation) the total signal to maximize SNR. The weight function can be constructed using an estimate for an expected NMR relaxation spectrum. The total signal can also be calculated as a sum of amplitudes of the NMR relaxation spectrum obtained, for example, using a multi-exponential decomposition technique (in this case the total NMR signal is equivalent to the amplitude of the relaxation curve $s_{cal}$ (0), as defined in the equation 4). When using the NMR relaxation spectrum to calculate the total signal, only a longer fraction of the spectrum can be used to reduce effect of relatively noisy fast relaxation fraction (affecting the first spin-echoes) of the NMR relaxation spectrum.

Figure 5:
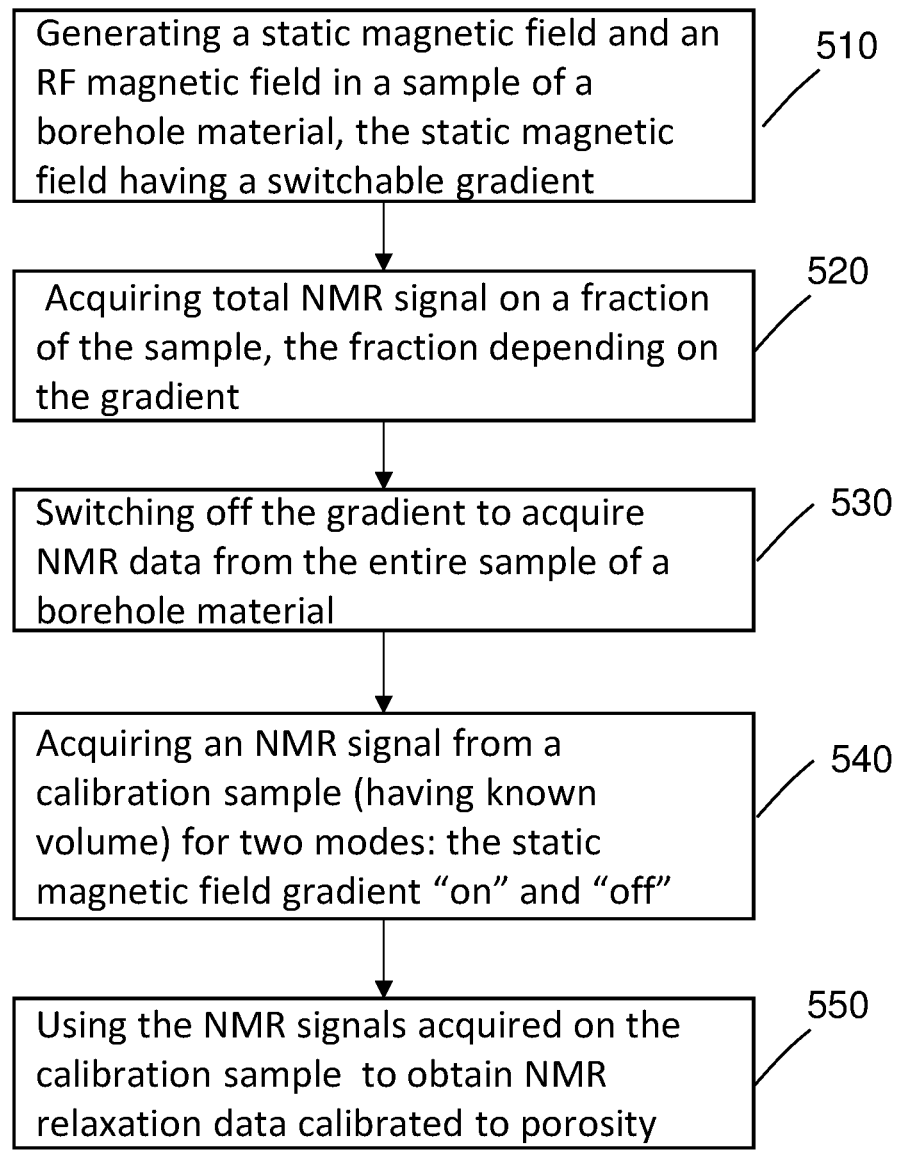
FIG. 5 illustrates an embodiment of a high-throughput NMR measurement using switchable gradient of static magnetic field.

The steps of the method using the static magnetic gradient to select a fraction of the sample as the sensitivity volume are presented in FIG. 5. The method includes generating a static magnetic field and an RF magnetic field in a sample of a borehole material to excite NMR (510). The static magnetic field has a switchable gradient in the direction of the sample axis. The method further includes acquiring total NMR signal on a fraction of the sample (520), The fraction may be controlled by the gradient of the static magnetic field, by the RF magnetic field pulse width or/and by the receiver bandwidth. Then the gradient is switched off to acquire NMR data from the entire sample (530). To determine the sample volume the NMR measurements are conducted (540) on a calibration sample with known volume and known hydrogen content (typically doped water). The calibration measurements are performed in two modes: with and without the gradient. The NMR data acquired on the sample of a borehole material and on the calibration sample are processed to obtain NMR relaxation data calibrated to porosity (presented in porosity units). The data can be further processed (550) to calculate an NMR relaxation spectrum and its parameters. The relaxation spectra and the parameters measured on the samples from different depths may be compared and processed together with downhole logging data, in particular, with downhole NMR logging data for the purpose of the earth formation evaluation.

Figure 6A:
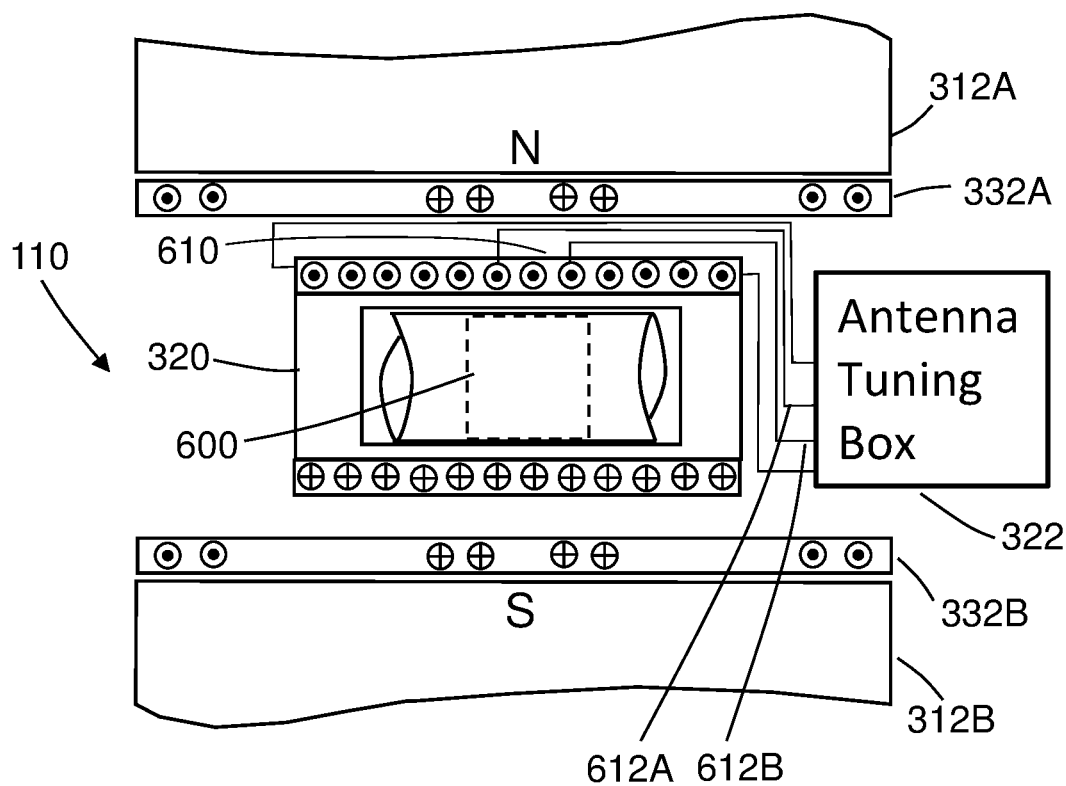
FIG. 6A is a partial view of a sensor unit of a high-throughput automated low field NMR relaxometer having two (switchable) configurations of NMR antenna.

Another embodiment of the sensor unit to implement method of FIG. 4 is presented in FIG. 6A. The fraction of the sample with the fraction volume (shown at 600) independent of the sample volume is selected using a localized (inhomogeneous) RF magnetic field produced by a central section 610 of the antenna 320. The central section is connected (leads 612A and 612B) to the antenna tuning box 322 to tune the central section to the NMR excitation frequency.

Figure 6B:
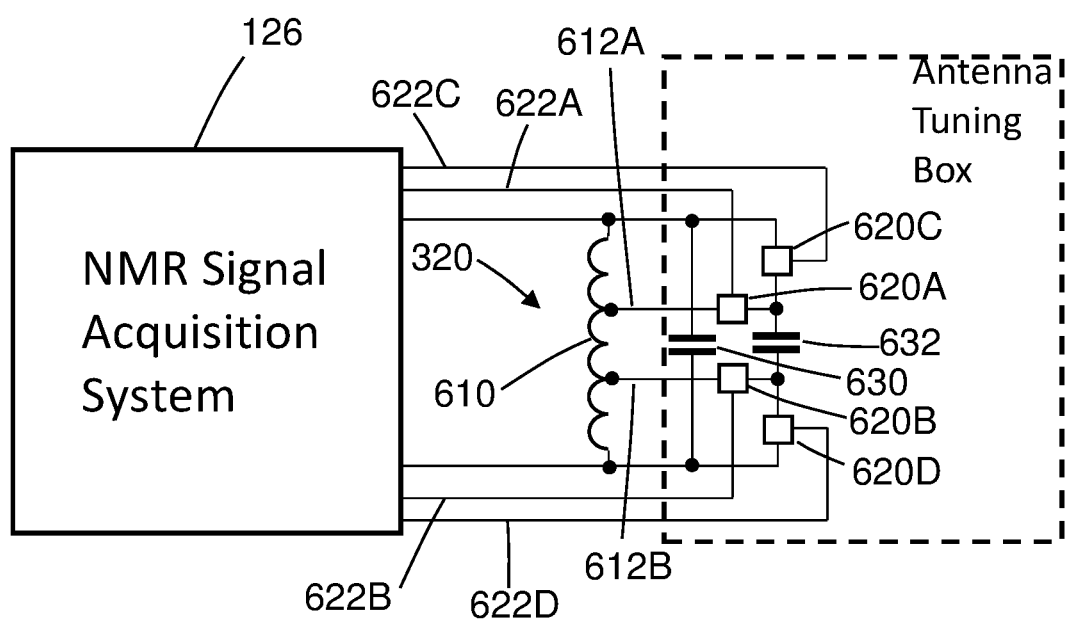
FIG. 6B presents an exemplary electrical circuit to implement a switchable configuration of the NMR antenna.

FIG. 6B presents an example of an electrical circuit to implement the two operating modes of the antenna: (i) acquiring NMR signal from a defined fraction of the sample and (ii) acquiring NMR signal from the entire sample. Electronic switches 620A, 620B, 620C and 620D are used to switch between the antenna operating modes. The switches are controlled (leads 622A, 622B, 622C and 622D) from the NMR signal acquisition system 126. When the switches are "off" (non-conducting) the central section 610 and the additional capacitor 632 are effectively disconnected from the rest of the circuit. The antenna 320 is tuned to the NMR excitation frequency using the main tuning capacitor 630 (no switches and, therefore, additional losses are present in the tuned antenna tank in this mode). In this mode the NMR signal is acquired from the entire sample. When the switches are "on", only the central section 610 is participating in the RF field generation and the signal detection (the end sections of the antenna are short-circuited). In this mode the central section is tuned to the NMR excitation frequency with the capacitors 630 and 632 connected in parallel.

Figure 7:
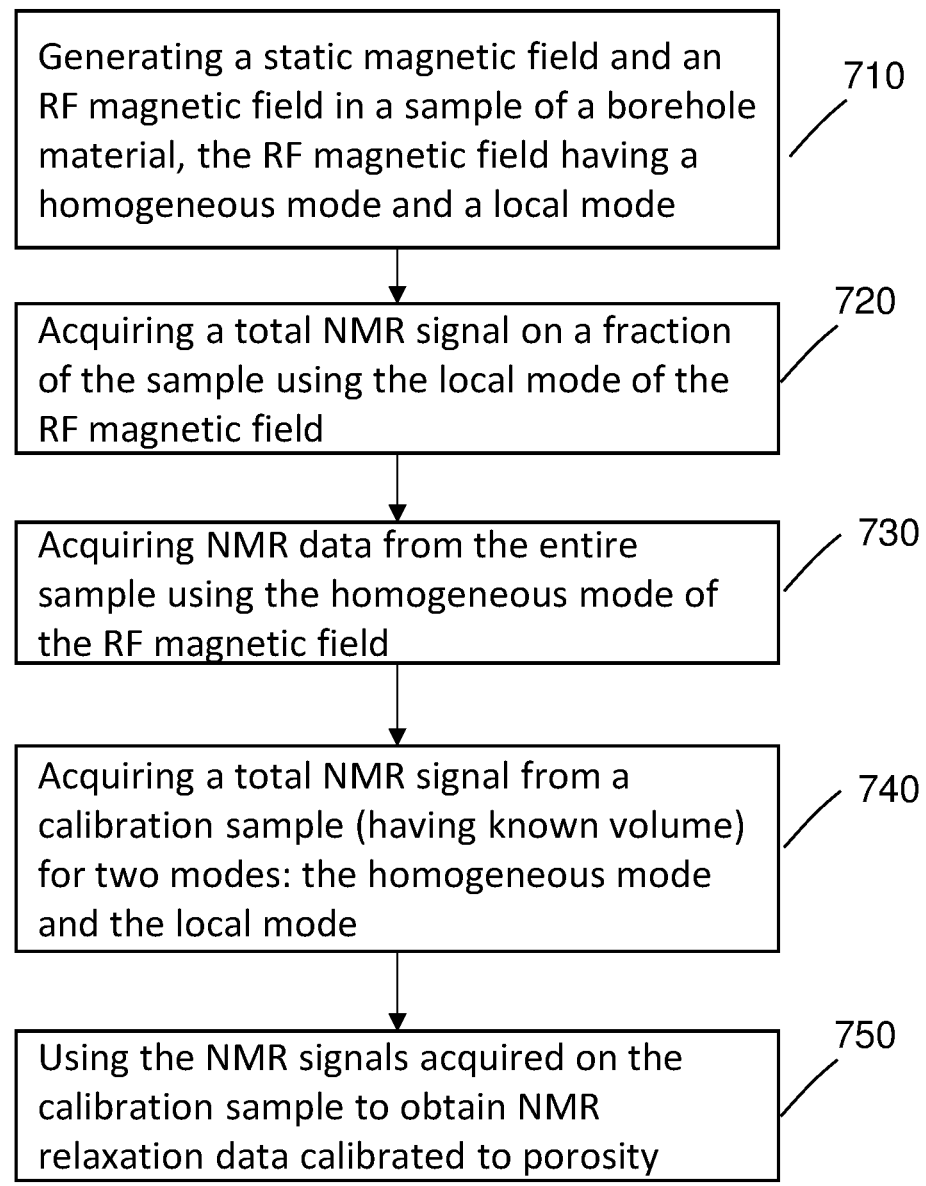
FIG. 7 illustrates a method of a high-throughput NMR measurement using reconfigurable (switchable configuration) NMR antenna.

FIG. 7 summarizes a method using the sensor unit with reconfigurable (switchable configuration) antenna presented in FIG. 6A and FIG. 6B. A static magnetic field and an RF magnetic field are generated (710) in a sample of a borehole material with the RF magnetic field having a homogeneous mode and a local (inhomogeneous) mode. Then a total NMR signal is acquired on a fraction of the sample using the local mode (720) of the RF magnetic field and on the entire sample using the homogeneous mode (730) of the RF magnetic field. Also acquired (740) is an NMR signal from a calibration sample (having known volume) for the same two modes: the homogeneous mode and the local mode. The NMR signals acquired on the calibration sample is used (750) to obtain NMR relaxation data calibrated to porosity.

As explained above, an axial position of the slice selected using a uniform gradient of the static magnetic field may be controlled by changing the frequency of the RF magnetic field or by adding a controllable homogeneous static magnetic field, e.g., produced by coils similar to ones shown at 332A and 332B (driven with a direct current). Controlling the excitation slice thickness and position can be used to generate a one-dimensional axial image, in particular, an axial distribution of NMR relaxation properties in the sample. Alternatively, the image can be obtained by moving the sample relative to the position of the excitation slice. The axial image (profile) acquired on an "as received" sample as well as acquired during the sample saturation or desaturation may be interpreted in terms of filtration properties of rock formations. The image (signals from multiple axially arranged slices with their planes perpendicular to the axis) of the sample can be also used to determine the volume of the sample.

The automated system presented in FIG. 2 may include a weight sensor (not shown in FIG. 2) also controlled by the controller 230. The weight sensor readings m in combination with the volume data V derived as explained above (equations (5)-(7)) enable a bulk density $\rho=m/V$ to be obtained. The bulk density carries additional petrophysical information.

While the invention has been described with respect to a limited number of embodiments, those skilled in the art, having benefits of this disclosure, will appreciate that other embodiments can be devised which do not depart from the scope of invention as disclosed herein.

What I claim as my invention is:

1. A method for a high-throughput nuclear magnetic resonance (NMR) measurement on a sample of a borehole material having an unknown volume, the method comprising:
   performing a first NMR measurement having a first sensitivity volume, the first sensitivity volume covering an entire volume of the sample;
   performing a second NMR measurement having a second sensitivity volume covering a fraction of the sample; and
   jointly processing NMR data acquired from the first NMR measurement and from the second NMR measurement to obtain a volume normalized property of the sample.

2. The method of claim 1, wherein the step of jointly processing NMR data includes using data acquired from NMR measurements on a calibration sample in order to obtain the volume normalized property of the sample, the property calibrated to porosity.

3. The method of claim 2, wherein the calibration sample has a known volume.

4. The method of claim 1, wherein performing the first NMR measurement includes generating a substantially homogeneous over the entire volume of the sample static magnetic field and a substantially homogeneous over the entire volume of the sample radio-frequency (RF) magnetic field and the second sensitivity volume is selected using inhomogeneity of at least one of (i) the static magnetic field and (ii) the RF magnetic field.

5. The method of claim 4, wherein the second sensitivity volume is selected by a static magnetic field gradient and the step of performing a second NMR measurement includes acquiring an image of the sample in order to determine at least one of (i) a volume of the sample and (ii) a spatial distribution of an NMR property of the sample.

6. The method of claim 1, further comprising performing a weight measurement and calculate a bulk density of the sample.

7. The method of claim 1, wherein at least one of (i) the step of performing the first NMR measurement and (ii) the step of performing the second NMR measurement includes using a CPMG pulse sequence producing a sequence of spin-echo signals, each of the spin-echo signals making a point on an NMR relaxation curve.

8. The method of claim 1, wherein the step of jointly processing NMR data includes using a total spin-echo signal in order to increase a signal-to-noise ratio of measurements.

9. The method of claim 1, wherein the samples of a borehole material are taken from different depths of a borehole and the volume normalized property of the samples are compared to and processed together with downhole logging data from the corresponding depths as a part of a formation evaluation process.

10. A method of NMR measurements on a sample of a borehole material, the method comprising:
    generating a static magnetic field and a radio-frequency (RF) magnetic field in the sample, an at least one of (i) the static magnetic field and (ii) the RF magnetic field having a homogeneous field operation mode and an inhomogeneous field operation mode;
    acquiring a total NMR signal from a fraction of the sample using the inhomogeneous field operation mode;
    acquiring NMR data from the sample using the homogeneous field operation mode;
    acquiring a first total NMR signal from a calibration sample in the homogeneous field operation mode and a second total NMR signal from a calibration sample in the inhomogeneous field operation mode, the calibration sample having a known volume; and
    using the total NMR signal from a fraction of the sample, the NMR data from the sample and the first and second total NMR signals from the calibration sample to obtain NMR relaxation data calibrated to porosity.

11. The method of claim 10, wherein the inhomogeneous field operation mode of the static magnetic field uses a gradient of the static magnetic field.

12. The method of claim 10, wherein the inhomogeneous field operation mode of the RF magnetic field uses a localized RF magnetic field.

13. The method of claim 10, wherein the step of generating a static magnetic field and a radio-frequency (RF) magnetic field in the sample uses both the static magnetic field and the RF magnetic field in the inhomogeneous field operation mode in order to increase signal-to-noise ratio of measurement of the NMR relaxation data.

14. An apparatus for high-throughput NMR measurements on a sample of a borehole material comprising:
    a source of a static magnetic field and a source of an RF magnetic field, an at least one of (i) the source of a static magnetic field and (ii) the source of an RF magnetic field configured to have a homogeneous field operation mode and an inhomogeneous field operation mode;

an acquisition system coupled to the source of an RF magnetic field, the system configured to acquire a first set of NMR signals in the homogeneous field operation mode and a second set of NMR signals in the inhomogeneous field operation mode; and a processor configured to jointly process the first and the second sets of NMR signals to determine a volume normalized property of the sample.

15. The apparatus of claim 14, wherein the first set of NMR signals and the second set of NMR signals are acquired in a form of a CPMG sequence of spin-echo signals to enable acquisition of NMR relaxation data.

16. The apparatus of claim 14, wherein the source of a static magnetic field includes a switchable static magnetic field gradient source, comprising a gradient coil and a current source, the switchable static magnetic field gradient source configured to select a sensitivity volume covering a fraction of the sample.

17. The apparatus of claim 14, wherein the source of an RF magnetic field includes a sectional antenna, and a switchable tuning box, the sectional antenna, and the switchable tuning box configured to enable switching between the homogeneous RF field operation mode and the inhomogeneous RF field operation mode, the inhomogeneous RF field operation mode used to select a sensitivity volume covering a fraction of the sample, the fraction being independent of a volume of the sample.

18. The apparatus of claim 14, further comprising an automated sample transfer system having a sample cassette with at least one sample selected to be a calibration sample having a known volume.

19. The apparatus of claim 14, further comprising a weight sensor, wherein the processor is configured to calculate a bulk density of the sample.

* * * * *